(12) United States Patent
Lee et al.

(10) Patent No.: US 11,606,881 B2
(45) Date of Patent: Mar. 14, 2023

(54) ELECTRONIC DEVICE HAVING ELECTRONIC COMPONENTS WITH DIFFERENT TEMPERATURE SPECIFICATIONS

(71) Applicant: WISTRON NEWEB CORPORATION, Hsinchu (TW)

(72) Inventors: Chien Lee, Hsinchu (TW); Ying-Chih Liu, Hsinchu (TW); Pao-Heng Chen, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 0 days.

(21) Appl. No.: 17/383,767

(22) Filed: Jul. 23, 2021

(65) Prior Publication Data

US 2022/0295663 A1    Sep. 15, 2022

(30) Foreign Application Priority Data

Mar. 12, 2021    (TW) .................................. 110108883

(51) Int. Cl.
  *H05K 7/20* (2006.01)
  *H05K 5/02* (2006.01)
  *H05K 7/14* (2006.01)

(52) U.S. Cl.
  CPC ......... *H05K 7/2039* (2013.01); *H05K 5/0217* (2013.01); *H05K 7/1427* (2013.01)

(58) Field of Classification Search
  CPC ... H05K 7/2039; H05K 5/0217; H05K 7/1427
  See application file for complete search history.

(56) References Cited

U.S. PATENT DOCUMENTS 9,668,377 B2 *   5/2017  Lim ..................... H05K 1/0203
2021/0259131 A1 *  8/2021  Ide ............................. G06F 1/20

FOREIGN PATENT DOCUMENTS

TW          201010584 A       3/2010
TW          M529148 U         9/2016

* cited by examiner

*Primary Examiner* — Jinhee J Lee
*Assistant Examiner* — Hung Q Dang
(74) *Attorney, Agent, or Firm* — McClure, Qualey & Rodack, LLP (57) ABSTRACT

An electronic device is provided. The electronic device includes a housing, a first circuit board, and a first heat sink. The housing forms a receiving space. The first circuit board and the first heat sink are received in the receiving space along the gravity direction. One side of the first circuit board has at least one electronic element. The first heat sink has a first base board and at least first side board. The first base board is arranged adjacent to the first circuit board. The electronic element transferred heat to the first base board. The first side board connects to the first base board, and cooperatively forms a first heat dissipating channel along the gravity direction. The first side board is close to or contacts the housing, so that the heat of the electronic element can be transferred by heat conduction and heat convection to dissipate outside.

11 Claims, 8 Drawing Sheets

ELECTRONIC DEVICE HAVING ELECTRONIC COMPONENTS WITH DIFFERENT TEMPERATURE SPECIFICATIONS

CROSS-REFERENCE TO RELATED PATENT APPLICATION

This application claims the benefit of priority to Taiwan Patent Application No. 110108883, filed on Mar. 12, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device, and more particularly to an electronic device with heat-generating electronic components.

BACKGROUND OF THE DISCLOSURE

With the development of semiconductor manufacturing processes and the demand for high-speed electronic communications, heating elements (electronic components) such as integrated circuit chips (IC) generate more and more heat, which has become a heat dissipation problem for electronic devices. The current common heat dissipation technology is usually to provide a heat sink of a metal material (such as aluminum or copper) with good heat conduction, and make the chip contact the heat sink, so that the heat from the chip is conducted to the fin of the heat sink. The cost of the heat sink depends on its manufacturing process and materials, and usually accounts for a lot of cost.

In addition, in the face of electronic components that generate more heat, a fan is usually added to forcibly exhaust hot air, and the surrounding low-temperature air is directed into the periphery of the electronic components to dissipate heat. This method usually requires additional energy consumption and is usually accompanied by noise problems.

Another problem is that there are more and more types of electronic components, and their calorific value is different. With the development, the materials of electronic components should also be considered their heat resistance. That is, the heat sink is sufficient to dissipate the heat of all electronic components, but if the electronic components are not placed in an appropriate position, the electronic components with higher calorific value may affect the electronic components with lower calorific value.

Therefore, it has become an important issue for the industry to overcome the above-mentioned defect through improving structure designs of the electronic devices.

SUMMARY OF THE DISCLOSURE

In response to the above-referenced technical inadequacies, the present disclosure provides an electronic device which is to provide a heat sink that can utilize the airflow of thermal convection to improve the heat dissipation efficiency, and the structure can reduce the manufacturing cost.

The technical problem to be solved by the present disclosure is also to provide an electronic device. After the electronic components are sorted according to the temperature specification (Junction Temperature, Tj), they are properly arranged according to the convective direction of the hot air to prevent the waste heat of the electronic components from affecting each other.

In one aspect, the present disclosure provides an electronic device which includes a housing, a first circuit board and a first heat sink. The housing forms a receiving space. The first circuit board is received in the receiving space along a gravity direction. At least one electronic component is disposed on one side of the first circuit board. The first heat sink is received in the receiving space along the gravity direction. The first heat sink includes a first base board and at least one first side board. The first base board is arranged adjacent to the first circuit board. The heat of at least one electronic component is conducted to the first base board. The at least one side board is connected to the first base board. The first base board and the at least one side board form a first heat dissipating channel along the gravity direction. The at least one side board is close to or contacts the housing so as to dissipate the heat of the at least one electronic component by heat conduction and heat convection.

One of the beneficial effects of the present disclosure is that the electronic device provided by the present disclosure can increase the efficiency of system heat dissipation and reduce the cost of the heat sink through the coordination and optimization of the overall stacking structure, the arrangement of electronic components, and the structure design of the heat sink. Especially after sorting the electronic components according to the temperature specification (Junction Temperature, Tj), they are placed in accordance with the direction of hot air convection. The heat of the electronic components with different temperature specifications is conducted separately to avoid mutual influence. Finally, the heat dissipating channel of the heat sink accelerates the waste heat of the electronic components to be taken away through the air convection and the heat conduction with the housing. In addition, the heat sink of the present disclosure is suitable for the sheet metal manufacturing process, and can reduce the cost more than the die-casting and aluminum extrusion-casting processes.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
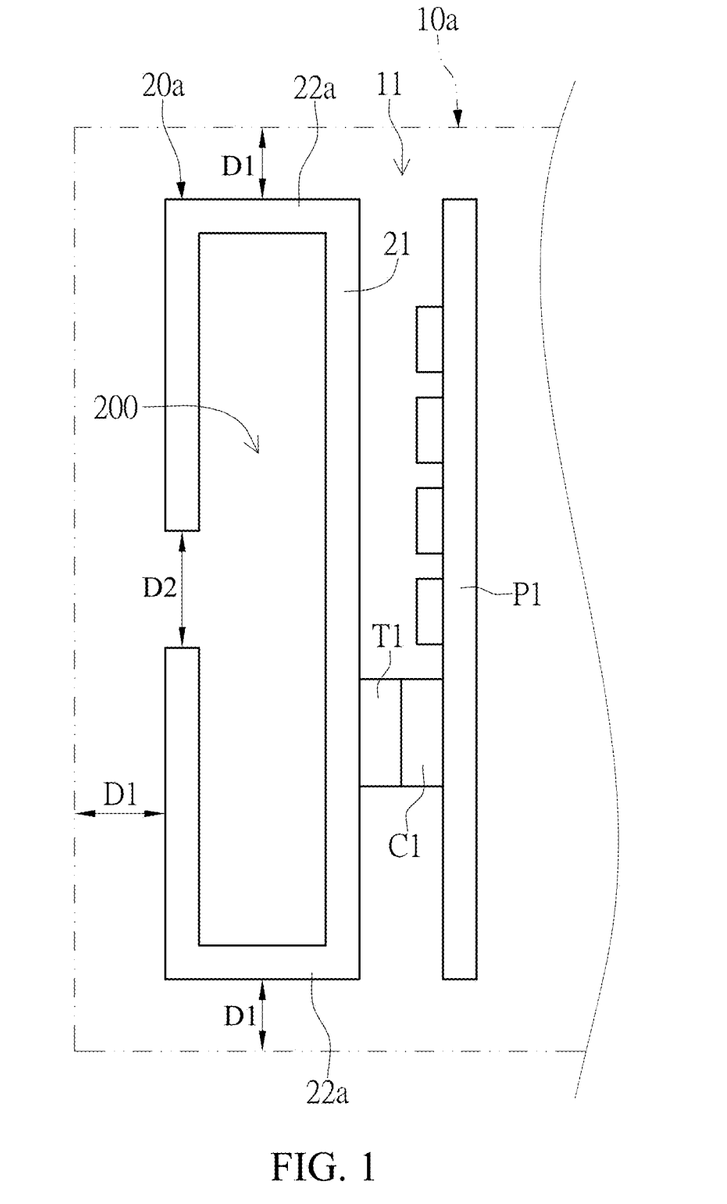
FIG. 1 is a cross-sectional view of an electronic device according to a first embodiment of the present disclosure.

Referring to FIG. 1, it is a cross-sectional view of an electronic device according to a first embodiment of the present disclosure. The electronic device 1 shown in FIG. 1 has substantially the same structure along the upright direction, and may also be referred to as an upright electronic device below. The upright direction in the present disclosure refers to a gravity direction, which means that the electronic device is placed upright on a desktop. Specifically, this embodiment can be applied to an upright network electronic device. However, the present disclosure is not limited thereto. With the advancement of network communication functions and the rise of "fifth generation mobile communication technology" in network electronic devices, high transmission volume is accompanied by higher power consumption and more difficult heat dissipation issues. It is the goal of the present disclosure to refine the internal structure under the upright structure to increase the efficiency of system heat dissipation and reduce the cost of the heat dissipation structure.

An upright electronic device 1 of a first embodiment includes a housing 10a, a first circuit board P1, and a first heat sink 20a. The cross-sectional shape of the housing 10a is rectangular, which is only partially shown. Specifically, in this embodiment, the housing 10a may be an upright rectangular cuboid. The housing 10a forms a receiving space 11. One side of the first circuit board P1 is adjacent to the first heat sink 20a. The first circuit board P1 and the first heat sink 20a are uprightly received in the receiving space 11 along a gravity direction.

A plurality of electronic components (C1, C2) are disposed on one side of the first circuit board P1. Specifically, the electronic components are integrated circuit (IC) chips, such as a central processing unit, a memory, a radio frequency integrated circuit chip, or a power amplifier (PA). Among them, the power amplifier is an important component in the RF transmission circuit. The main function of PA is to amplify the signal. It is usually designed at the front end of the antenna radiator and is also the most power-consuming component in the entire RF front-end circuit. In other words, the power amplifier is usually an electronic component with high power consumption and high temperature specification (Junction Temperature Tj). The higher temperature specification means that the material and structure of the power amplifier are designed to withstand higher temperatures. One of the characteristics of the present disclosure is to arrange the height positions of the electronic components according to temperature specifications, which will be described in detail later.

The first heat sink 20a is received uprightly in the receiving space 11 along the gravity direction. The first heat sink 20a has a first base board 21 and at least one first side board 22a. The first base board 21 is adjacent to the first circuit board P1, and the heat of the electronic components (C1, C2) is conducted to the first base board 21. The at least one first side board 22a is connected to the first base board 21. The at least one first side board 22a and the first base board 21 forms a first heat dissipating channel 200 along the gravity direction. The at least one first side board 22a is adjacent to or in contact with the housing 10a. The heat of the plurality of electronic component (C1, C2) is dissipated to the outside through heat conduction and heat convection. Cooperating with the heat dissipation airflow of the first heat sink 20a, a plurality of ventilation holes are formed on the top and bottom of the housing 10a (101, 102, refer to the embodiments of FIGS. 5 and 6). In other words, the first heat dissipating channel 200 formed by the first heat sink 20a corresponds to the ventilation holes (101, 102, refer to FIGS. 5 and 6). The heat of the plurality of electronic component (C1, C2) is conducted to the first base board 21 through a thermal interface material (TIM) T1. TIM is coated between the electronic components and the heat sink to fill the micro-voids and uneven holes on the surface when the two materials are joined or contacted, and reduce the resistance of heat transfer and improve heat dissipation. For example, liquid thermal grease (Thermal grease), or thermally conductive gap filler.

The first heat sink 20a has a pair of first side boards 22a. The pair of first side boards 22a are bent and extended from both sides of the first base board 21 to form the first heat dissipating channel 200. The outer shape of the pair of first side boards 22a corresponds to the housing 10a. In other words, the gap D1 between the pair of first side boards 22a and the inner surface of the housing 10a is substantially the same. The pair of first side boards 22a extend along the inner surface of the housing 10a and are close to each other. And the edges of the pair of first side boards 22a are close to each other and are separated by a width D2. The above-mentioned width D2 can be as small as possible, and even the edges of the pair of first side boards 22a are contacted each other, so that the sealing around the first heat dissipating channel 200 is better, which is more conducive to the guidance of airflow. The gap D1 is also as small as possible, so that the first side board 22a is adjacent to or in contact with the housing 10a, which also facilitates heat conduction through the housing 10a to the outside.

The first heat sink 20a of this embodiment may be made by a sheet metal manufacturing process, but the present disclosure is not limited thereto. It may also be die-casting molding or extrusion molding. In accordance with the shape of the first heat sink 20a of this embodiment, the sheet metal manufacturing process is preferably applicable. Compared with the die-casting molding or aluminum extrusion molding, the sheet-metal manufacturing process can save molds and reduce costs. Another advantage of this embodiment is that the heat on the electronic components (C1, C2) is dissipated outward through air convection and heat conduction with the housing 10a through the mouth-shaped sheet metal heat sink. After simulation, the heat sink of the sheet metal manufacturing process is even better than the heat sink of die-casting or aluminum extrusion-casting.

Second Embodiment

Figure 2:
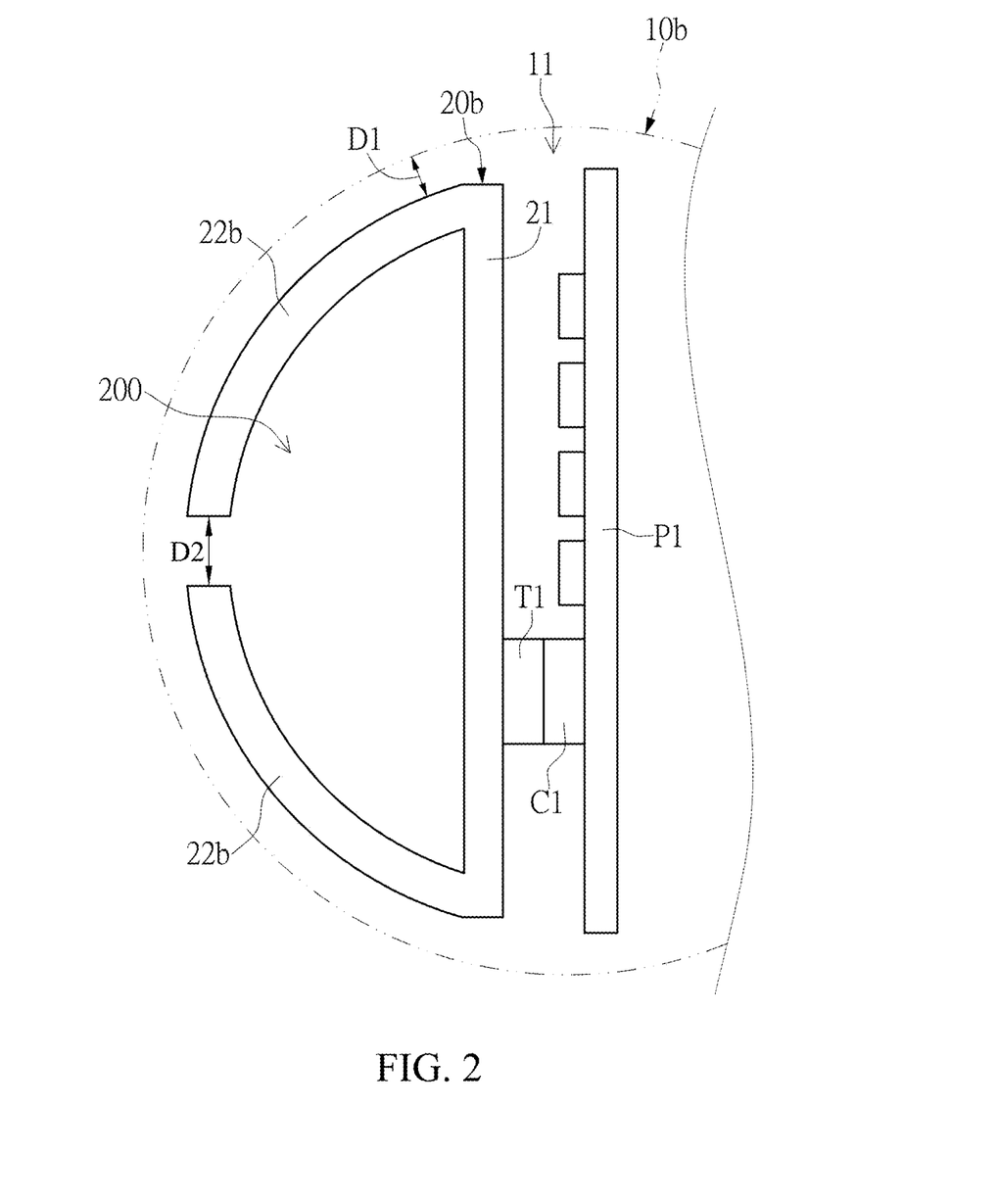
FIG. 2 is a cross-sectional view of an electronic device according to a second embodiment of the present disclosure.

Referring to FIG. 2, it is a cross-sectional view of an upright electronic device according to a second embodiment of the present disclosure. The difference between the second embodiment and the first embodiment is that the housing 10b is cylindrical. The shape of the first heat sink 20b of the present embodiment is semi-cylindrical in accordance with the cylindrical housing 10b. The first heat sink 20b has a first base board 21 and a pair of arc-shaped first side boards 22b. The pair of first side boards 22b extend along the inner surface of the housing 10b and are close to each other. The shape of the first heat sink 20b can also be applied to the sheet metal manufacturing process, saving molds and reducing costs.

Third Embodiment

Figure 3:
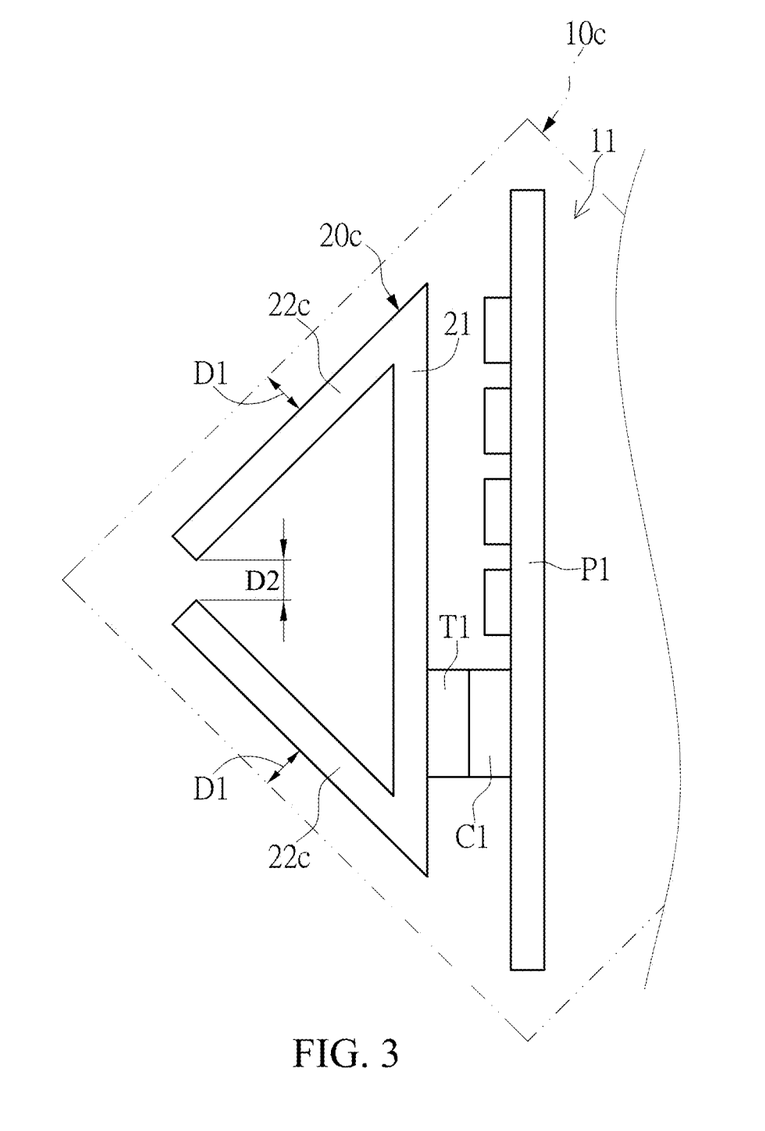
FIG. 3 is a cross-sectional view of an electronic device according to a third embodiment of the present disclosure.

Referring to FIG. 3, it is a cross-sectional view of an upright electronic device according to a third embodiment of the present disclosure. The difference between the third embodiment and the first embodiment is that the housing 10b is a rectangular cuboid or a rhombus cuboid. The shape of the first heat sink 20c of this embodiment matches the shape of the rectangular cuboid or the rhombus cuboid of the housing 10c, and is a hollow triangular column shape. The first heat sink 20c has a first base board 21 and a pair of flat plate-shaped first side boards 22c. The pair of first side boards 22c extend along the inner surface of the housing 10c and are close to each other. The shape of the first heat sink 20c can also be applied to the sheet metal manufacturing process, saving molds and reducing costs.

Fourth Embodiment

Figure 4:
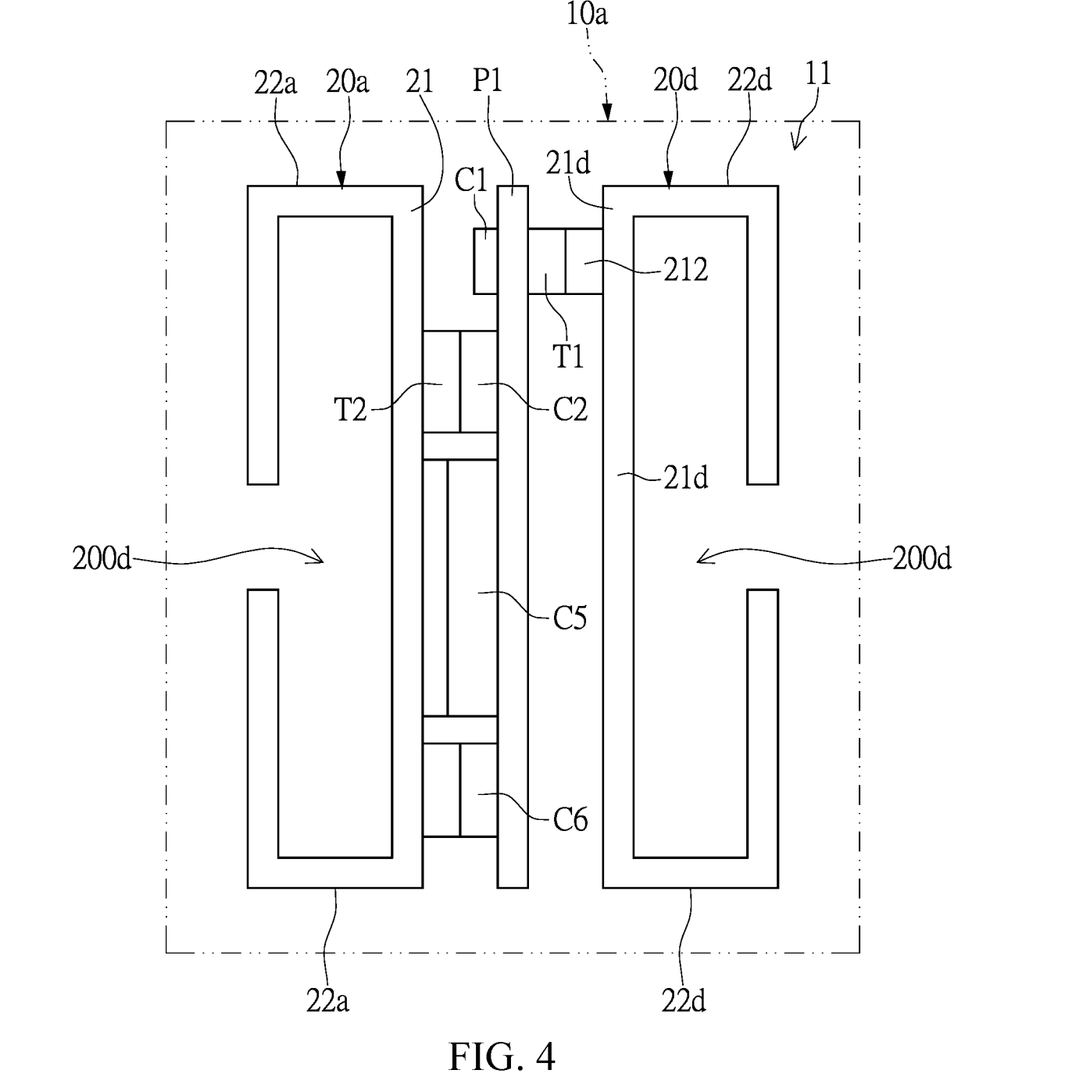
FIG. 4 is a cross-sectional view of an electronic device according to a fourth embodiment of the present disclosure.
Figure 5:
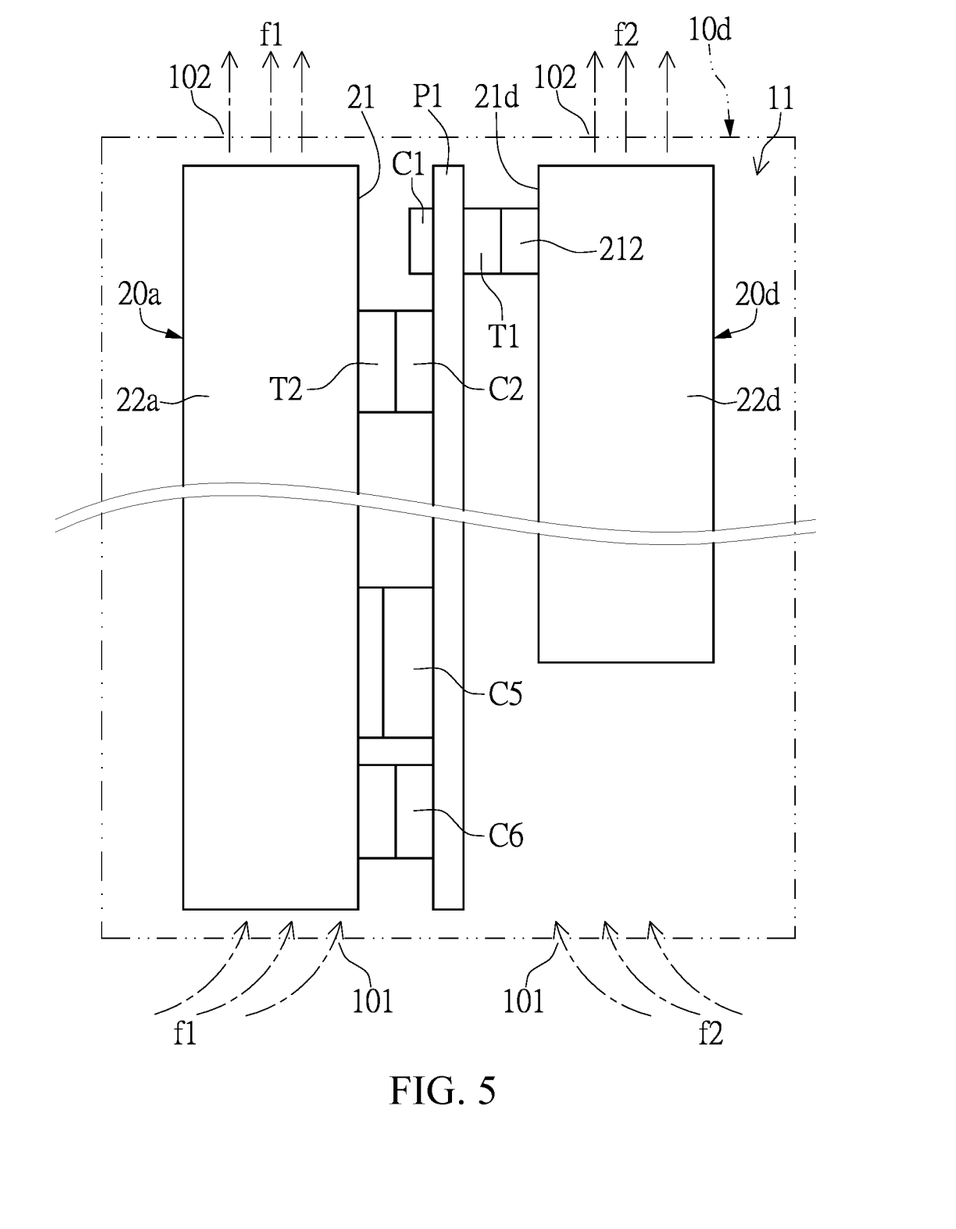
FIG. 5 is a side view of the electronic device according to the fourth embodiment of the present disclosure.

FIG. 4 and FIG. 5 are respectively a cross-sectional view and a side view of the upright electronic device 4 according to the third embodiment of the present disclosure. Compared with the first embodiment, the upright electronic device 4 of this embodiment further includes a second heat sink 20d in addition to the first heat sink 20a. The second heat sink 20d is disposed on the other side of the first circuit board P1 opposite to the first heat sink 20a. In this embodiment, the electronic components include a first electronic component C1 and a second electronic component C2, which respectively conduct heat to different heat sinks. Specifically, the heat of the first electronic component C1 is conducted to the second heat sink 20d through the thermal interface material T1, and the heat of the second electronic component C2 is conducted to the first heat sink 20a through the heat transfer interface layer T2. However, the present disclosure is not limited thereto. And the heat of the first electronic component C1 may be conducted to the first heat sink 20a, and the heat of the second electronic component C2 may be conducted to the second heat sink 20d.

The cross-sectional shape of the second heat sink 20d of this embodiment is similar to that of the first heat sink 20a. The second heat sink 20d has a second base board 21d and a pair of second side boards 22d. The pair of second side boards 22d are bent and extended from both sides of the second base board 21d, thereby forming a second heat dissipating channel 200d. The outer shape of the pair of second side boards 22d also corresponds to the housing 10a. The pair of second side boards 22d extend along the inner surface of the housing 10a and are close to each other, and the edges of the pair of second side boards 22d are close to each other. The housing 10a of this embodiment is similar to the first embodiment, and is an upright rectangular cuboid. However, it may be the same shape as the second and third embodiments. Alternatively, the shape of the second heat sink 20d may also be different from that of the first heat sink 20a, and the second heat sink 20d may be a plate-shaped heat sink body. (As shown in the heat sink 30 in the middle of FIG. 6)

As shown in FIG. 5, another feature of the present disclosure is that the height positions of the electronic components are arranged according to the temperature specifications of the electronic components. Specifically, the heat-resistant temperature of the first electronic component C1 is greater than the heat-resistant temperature of the second electronic component C2, that is, the temperature specification of the first electronic component C1 is higher than the temperature specification of the second electronic component C2. For example, the first electronic component C1 is a power amplifier (PA), and the other electronic components C2, C5, and C6 are central processing units, memory, or radio frequency integrated circuit chips, respectively, which are components with lower power consumption. In this embodiment, the position of the first electronic component C1 along the gravity direction is higher than the position of the second electronic component C2 along the gravity direction. In other words, the first electronic component C1 with a high temperature specification is located at the rear end (downstream) in the direction of the hot air convection (f1, f2), and the other second electronic components C2 are located at the front end (upstream) in the direction of the hot air convection (f1, f2). In this way, the heat generated by the first electronic component C1 will not affect the second electronic component C2. Furthermore, in this embodiment, the heat generated by the first electronic component C1 is conducted to the second heat sink 20d through the back surface of the first circuit board P1. The heat generated by the second electronic component C2 is conducted to the first heat sink 20a. That is, the heat of electronic component C1 and the heat electronic component C2 are conducted separately to different heat sinks. The advantage of this arrangement is that after sorting the electronic components according to the temperature specification (Junction Temperature, Tj). Electronic components are arranged according to the convection direction, and the heat of the electronic components with high and low temperature specifications is separately conducted to avoid mutual influence.

In addition, for example, the above-mentioned first electronic component C1 may be a power amplifier. In the art, due to the packaging method and characteristics of the power amplifier, heat can be transferred from the bottom of the power amplifier through the via hole (VIA) of the circuit board to the back. By placing the first circuit board P1 uprightly, the power amplifier (first electronic component C1) conducts heat to one side of the larger heat dissipation space, and the other electronic components with lower temperature specifications conduct heat to the other side, ensuring the heat from the power amplifier will not affect other electronic components and cause thermal damage.

As shown in FIG. 4, in this embodiment, the first electronic component C1 is preferably also staggered from the second electronic component C2 along a lateral direction perpendicular to the gravity direction. In other words, the first electronic component C1 and the second electronic component C2 are staggered along the hot air convection direction (f1, f2), so as to make the air flow smoother and avoid heat accumulation.

Fifth Embodiment

Figure 6:
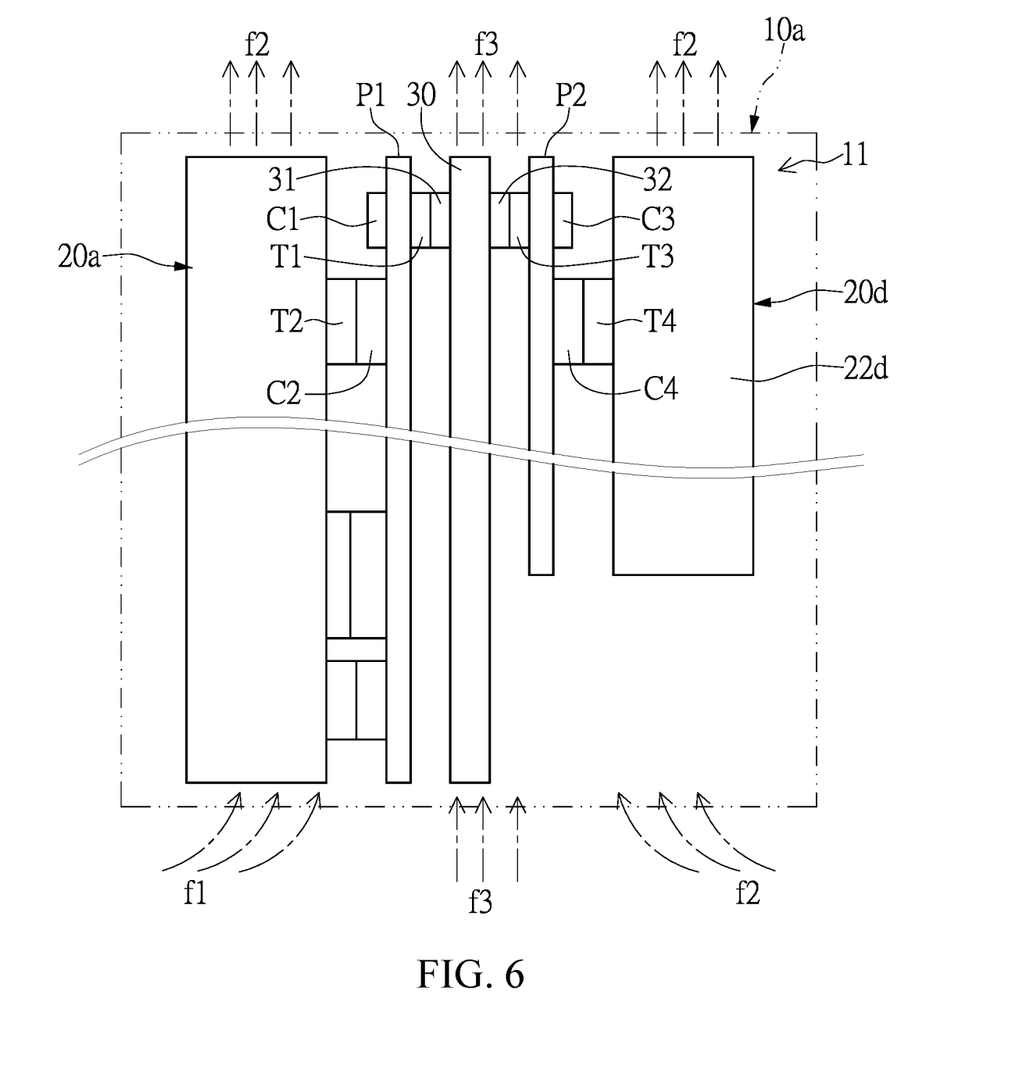
FIG. 6 is a side view of an electronic device according to a fifth embodiment of the present disclosure.

As shown in FIG. 6, it is a side view of the upright electronic device 5 according to a fifth embodiment of the present disclosure. The electronic device 5 further includes a second circuit board P2 and a third heat sink 30. The second circuit board P2 is disposed on one side of the second heat sink 20d, and the third heat sink 30 is disposed between the first circuit board P1 and the second circuit board P2. The third heat sink 30 is disposed on one side of the second circuit board P2 and the second circuit board P2 is disposed between the second heat sink 20d and the third heat sink 30. The second circuit board P2 includes a third electronic component C3 and a fourth electronic component C4. And the heat of the third electronic components C3 and the fourth electronic component C4 are conducted to the different heat sinks.

Specifically, the heat of the first electronic component C1 and the third electronic component C3 is conducted to the third heat sink 30. The first electronic component C1 and the third electronic component C3 may be electronic components with higher temperature specifications, i.e., with higher heat-resistant temperature. The third heat sink 30 has two heat conduction blocks 31 and 32, respectively protruding toward the first circuit board P1 and the second circuit board P2. And the heat of the first electronic component C1 is conducted to the heat conduction block 31 through the thermal interface material T1. The heat of the third electronic component C3 is conducted to the heat conduction block 32 through the thermal interface material T3. The second electronic component C2 and the fourth electronic component C4 may be electronic components with lower temperature specifications. The heat of the second electronic component C2 and the fourth electronic component C4 are conducted to the first heat sink 20a and the second heat sink 20d, respectively.

The heat conduction blocks 31 and 32 of the third heat sink 30 help form the space of heat convection between the first circuit board P1 and the second circuit board P2 and help form hot air convection f3. When electronic components with different thicknesses are disposed to face the third heat sink 30, the heat conduction blocks 31 or 32 may also protrude forward to a thinner electronic component to decrease the space between the thinner electronic component and the heat sink 30. It would prevent the thickness of the thermal interface material on the thinner electronic component from being too thick.

Sixth Embodiment

Figure 7:
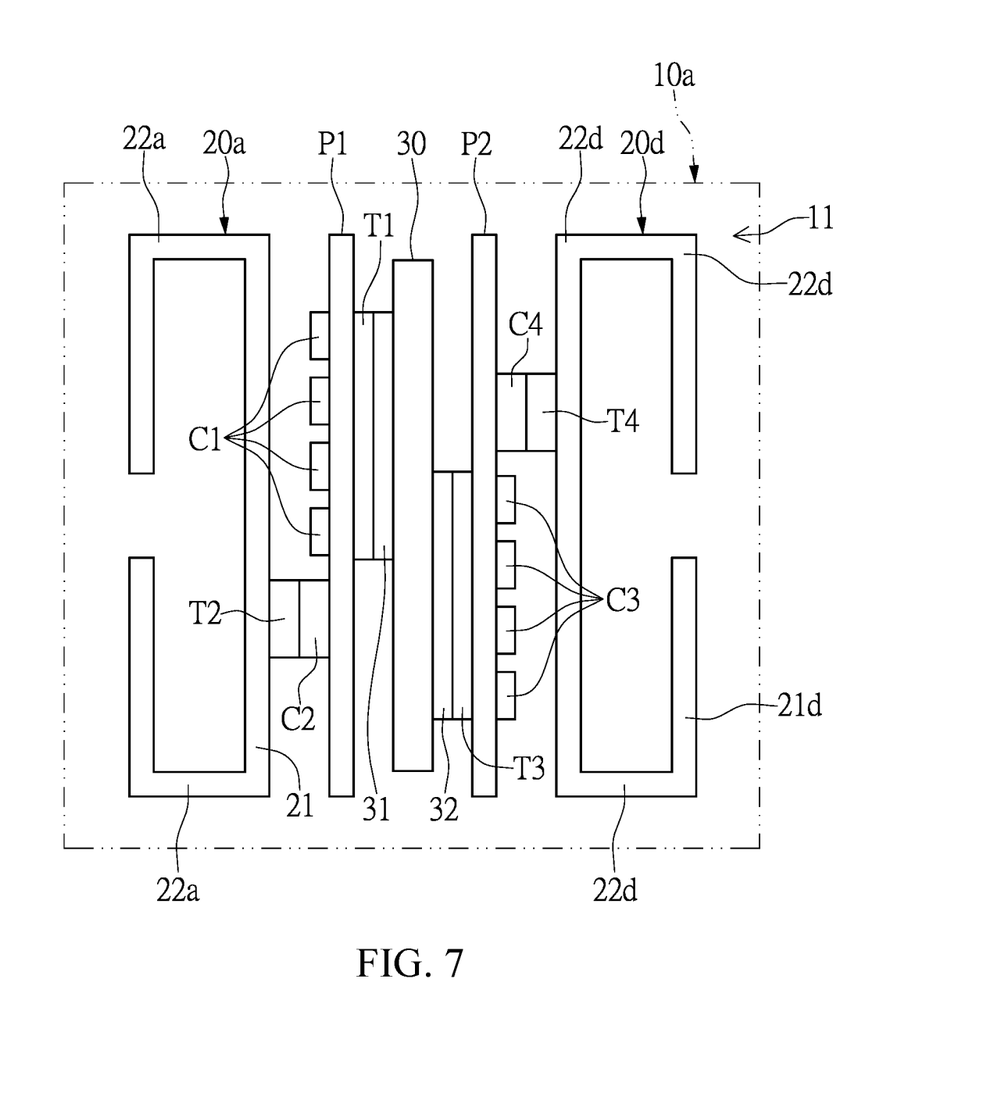
FIG. 7 is a cross-sectional view of an electronic device according to a sixth embodiment of the present disclosure.

As shown in FIG. 7, it is a top view of an upright electronic device according to a sixth embodiment of the present disclosure. In the upright electronic device 6 of this embodiment, the first electronic components C1 are staggered from the second electronic component C2 along a lateral direction perpendicular to the gravity direction. The third electronic components C3 are staggered from the fourth electronic component C4 along the lateral direction perpendicular to the gravity direction. In this embodiment, the second electronic component C2 of the first circuit board P1 faces the first heat sink 20a, and the fourth electronic component C4 of the second circuit board P2 faces the second heat sink 20d. The effect of the above-mentioned lateral staggered arrangement of the electronic components is that the electronic components are staggered along the convection direction of the hot air, thereby making the air flow smoother and avoiding heat accumulation.

In addition, according to the present embodiment, the residual heat emitted by the electronic components can be respectively connected to heat sinks with different areas. The first electronic component C1 and the third electronic component C3 may be components with higher temperature specifications, such as a power amplifier (PA)

The third heat sink 30 of this embodiment has two heat conduction blocks 31 and 32. The heat conduction block 31 on the left corresponds to the positions of multiple electronic components (including the first electronic components C1), and the heat conduction block 32 on the right corresponds to the positions of multiple electronic components (including the third electronic components C3).

Seventh Embodiment

Figure 8:
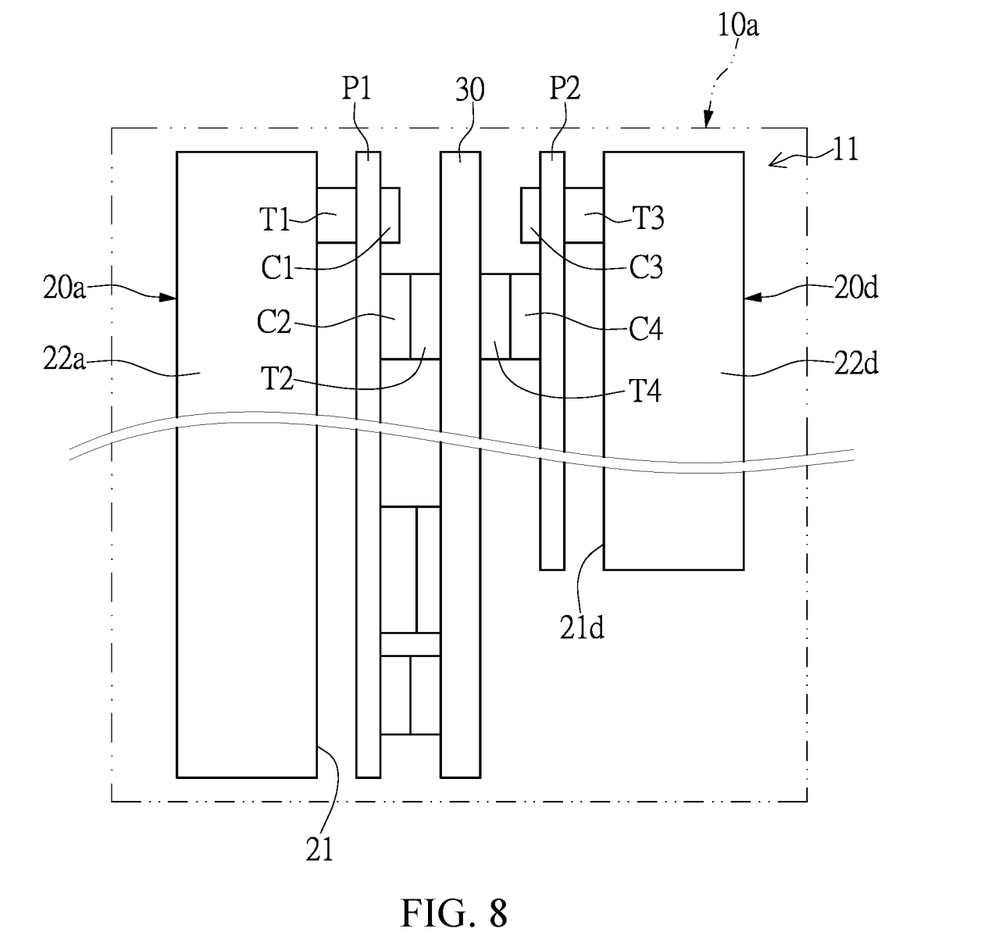
FIG. 8 is a side view of an electronic device according to a seventh embodiment of the present disclosure.

As shown in FIG. 8, it is a side view of an electronic device according to a seventh embodiment of the present disclosure. In the upright electronic device 7 of this embodiment, the first electronic component C1 of the first circuit board P1 faces away from the first heat sink 20a, and other electronic components (including the second The electronic component C2) faces the third heat sink 30. The third electronic component C3 of the second circuit board P2 faces away from the second heat sink 20d, and other electronic components (including the fourth electronic component C4) of the second circuit board P2 face the third heat sink 30. The first electronic component C1 and the third electronic component C3 may be components with higher temperature specifications, such as a power amplifier (PA).

One of the beneficial effects of the present disclosure is that the electronic device provided by the present disclosure can increase the efficiency of system heat dissipation and reduce the cost of the heat sink through the coordination and optimization of the overall stacking structure, the arrangement of electronic components, and the structure design of the heat sink. Especially after sorting the electronic components according to the temperature specification (Junction Temperature, Tj), the electronic components are placed in accordance with the direction of hot air convection. The heat of the electronic components with different temperature specifications is conducted separately to avoid mutual influence. Finally, the heat dissipating channel formed by the heat sink accelerates the waste heat of the electronic components to be taken away through the air convection and the heat conduction with the housing. In addition, the heat sink of the present disclosure is suitable for the sheet metal manufacturing process, and can reduce the cost more than the die-casting and aluminum extrusion-casting processes.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:
a housing, forming a receiving space;
a first circuit board, received in the receiving space and erected along a gravity direction, the first circuit board including a first electronic component and a second electronic component disposed on one side of the first circuit board, a temperature specification of the first electronic component is higher than that of the second electronic component, a position of the first electronic component along the gravity direction is higher than a position of the second electronic component along the gravity direction; and
a first heat sink, received in the receiving space along the gravity direction, the first heat sink including a first base board extended along the gravity direction and at least one first side board extended along the gravity direction, the first base board being arranged adjacent to the first circuit board, at least one of the first and the second electronic components conducting heat to the first base board, the at least one first side board connected to the first base board, the first base board and the at least one first side board forming a first heat dissipating channel along the gravity direction and parallel to the first circuit board, the first electronic component and the second electronic component being arranged outside the first heat dissipating channel, the at least one side board being close to or contacting the housing so as to dissipate the heat of the first and second electronic components by heat conduction and heat convection.

2. The electronic device of claim 1, wherein the first heat sink includes a pair of the first side boards, the pair of first side boards are bent and extended from both sides of the first base board to form and encircle the first heat dissipating channel therein, the shapes of the pair of first side boards correspond to the housing, the pair of first side boards are extended along the inner surface of the housing and are close to each other, and the edges of the pair of first side boards are close to each other, and a plurality of ventilation holes are formed on a top and a bottom of the housing respectively corresponded to two ends of the first heat dissipating channel.

3. The electronic device of claim 2, further comprising a second heat sink, the second heat sink disposed on the other side of the first circuit board opposite to the first heat sink, wherein, when the heat from the first electronic component dissipates through the first heat sink, the heat from the second electronic component dissipates through the second heat sink, or when the heat from the first electronic component dissipates through the second heat sink, the heat of the second electronic component dissipates through the first heat sink.

4. The electronic device of claim 3, wherein the second heat sink includes a second base board and a pair of second side boards, the pair of second side boards are bent and extended from both sides of the second base board to form a second heat dissipating channel, the shapes of the pair of second side boards correspond to the housing, the pair of second side boards are extended along the inner surface of the housing and are close to each other, and the edges of the pair of second side boards are close to each other.

5. The electronic device of claim 3, wherein the heat-resistant temperature of the first electronic component is larger than the heat-resistant temperature of the second electronic component.

6. The electronic device of claim 5, wherein the first electronic component is staggered from the second electronic component along a lateral direction perpendicular to the gravity direction.

7. The electronic device of claim 3, further comprising a second circuit board and a third heat sink, the second circuit board disposed on one side of the second heat sink, and the third heat sink disposed between the first circuit board and the second circuit board, wherein the third heat sink is disposed on one side of the second circuit board and the second circuit board is disposed between the second heat sink and the third heat sink, wherein the second circuit board includes a third electronic component and the heat of the third electronic component is conducted to the third heat sink.

8. The electronic device of claim 7, wherein the third heat sink includes a heat conduction block protruding toward the first circuit board, the first electronic component dissipates heat to the third heat sink through a thermal interface material layer, the second electronic component dissipates heat through the second heat sink.

9. The electronic device of claim 7, wherein the first electronic component disposed on the first circuit board faces the first heat sink and the third electronic component disposed on the second circuit board faces the second heat sink.

10. The electronic device of claim 7, wherein the first electronic component disposed on the first circuit board faces the third heat sink and the third electronic component disposed on the second circuit board faces the third heat sink.

11. The electronic device of claim 3, wherein the first heat sink and the second heat sink are made by a sheet metal manufacturing process.

* * * * *